(12) United States Patent
Asami

(10) Patent No.: US 6,600,762 B2
(45) Date of Patent: Jul. 29, 2003

(54) WAVELENGTH-VARIABLE LIGHT SOURCE, AND OPTICAL COMPONENT LOSS MEASURING DEVICE

(75) Inventor: Keisuke Asami, Kanagawa (JP)

(73) Assignee: Ando Electric Co., Ltd., Tokyo (JP)

( * ) Notice: Subject to any disclaimer, the term of this patent is extended or adjusted under 35 U.S.C. 154(b) by 97 days.

(21) Appl. No.: 09/838,410

(22) Filed: Apr. 19, 2001

(65) Prior Publication Data

US 2002/0024977 A1 Feb. 28, 2002

(30) Foreign Application Priority Data

Apr. 24, 2000 (JP) ........................................ 2000-122593

(51) Int. Cl.⁷ .............................................. H01S 3/13
(52) U.S. Cl. ................. 372/29.021; 372/20; 372/29.02; 250/205; 359/110
(58) Field of Search ..................... 362/268, 29; 372/20, 372/29.02, 29.021, 102; 250/205; 359/110

(56) References Cited

U.S. PATENT DOCUMENTS

| | | | | |
|---|---|---|---|---|
| 4,682,841 A | * | 7/1987 | Afian et al. | .................... 359/15 |
| 5,016,149 A | * | 5/1991 | Tanaka et al. | ............... 362/268 |
| 5,929,951 A | * | 7/1999 | Sasakura et al. | .............. 362/29 |
| 6,288,803 B1 | * | 9/2001 | Hattori et al. | ................. 359/15 |

FOREIGN PATENT DOCUMENTS

JP        404010261 A  *  1/1992  .................. 369/83

* cited by examiner

*Primary Examiner*—Albert W. Paladini
(74) *Attorney, Agent, or Firm*—Fish & Richardson P.C.

(57) ABSTRACT

A wavelength-variable light source equipped with a semiconductor laser 1, one end of which is provided with an antireflection coating 1A, is equipped with a power correction filter 10 which permits transmission of the light output from the semiconductor laser 1, thereby rendering the characteristics of the output light substantially flat. The wavelength-variable light source is an external-resonator-type laser light source which converts the light output from the end face covered with the antireflection coating 1A of the semiconductor laser 1 into collimated light, subjects the light to wavelength selection by a wavelength selection optical element 2, returns the light to the wavelength selection optical element 2 by means of a mirror 3, to thereby subject the light again to wavelength selection by the wavelength selection optical element 2, feeds the light back to the semiconductor laser 1, and converges and outputs light output from the other end face of the semiconductor laser 1 on and to an optical fiber 4. The power correction filter 10 is interposed between the semiconductor laser 1 and the optical fiber 4.

15 Claims, 7 Drawing Sheets

OPTICAL OUTPUT CHARACTERISTIC OF LIGHT SOURCE

EXAMPLE OF MEASUREMENT OF TRANSMISSION LOSS IN OPTICAL COMPONENT

VARIATION IN LASER DRIVE CURRENT DURING APC (NOT HAVING POWER CORRECTION FILTER)

FIG. 13B

VARIATION IN LASER DRIVE CURRENT DURING APC (HAVING POWER CORRECTION FILTER)

FIG. 14 (PRIOR ART)

WAVELENGTH-VARIABLE LIGHT SOURCE, AND OPTICAL COMPONENT LOSS MEASURING DEVICE

BACKGROUND OF THE INVENTION

1. Field of the Invention

The present invention relates to a wavelength-variable light source used in the field of optical communication, as well as to a device for measuring optical component loss using the wavelength-variable light source.

2. Description of the Related Art

Figure 14:
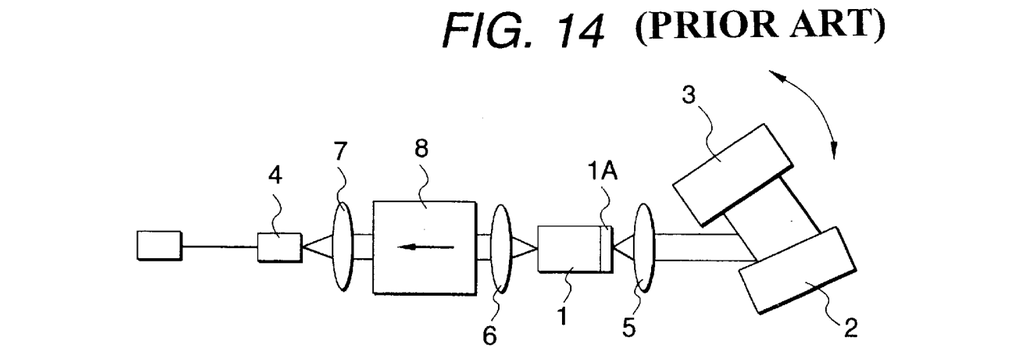
FIG. 14 is a schematic drawing showing an example of a related-art wavelength-variable light source.

FIG. 14 shows a wavelength-variable light source in the related-art. An antireflection coating 1A is provided on one side of a semiconductor laser 1, and the light exiting from the end covered with the antireflection coating 1A is collimated by a lens 5. The thus-collimated light is subjected to wavelength selection by a diffraction grating 2, and the thus-selected light returns to the diffraction grating 2 by means of the mirror 3. The light is again subjected to wavelength selection by the diffraction grating 2, and the light is fed back to the semiconductor laser 1, thereby effecting lasing.

The light output from the other end of the semiconductor laser 1 is converted into collimated light by means of a lens 6. After having passed through an optical isolator 8, the thus-collimated light is converged on an optical fiber 4 by means of a lens 7.

The light source shown in FIG. 14 is called a Littman type. During one round trip, the light is subjected to two rounds of wavelength selection by the diffraction grating 2. The light source is superior in wavelength selection characteristic and has been known as one of the most popular methods.

Figure 11:
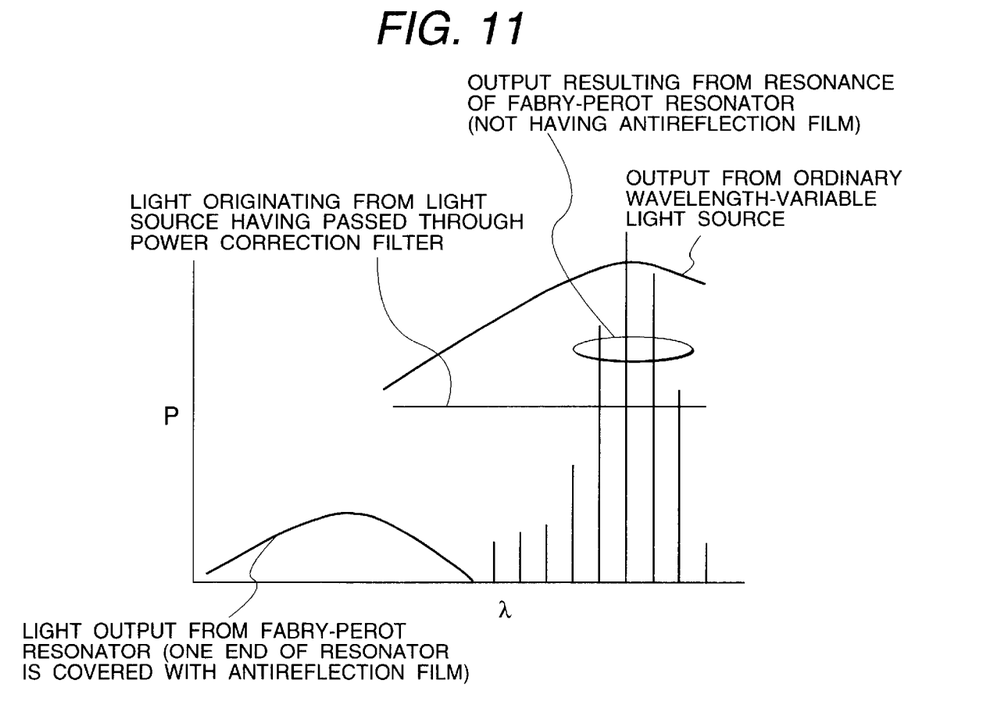
FIG. 11 is a characteristic drawing showing an example of output characteristics of various light sources.

In such a related-art wavelength-variable light source, as indicated by "output from ordinary wavelength-variable light source" shown in FIG. 11, the light that is output when the wavelength of the light is changed assumes an arch-shaped profile, because of gain distribution of the semiconductor laser 1. Here, the characteristic of an "output from an ordinary wavelength-variable light source" is determined by means of consecutively plotting outputs P produced at respective wavelengths λ.

Figure 8:
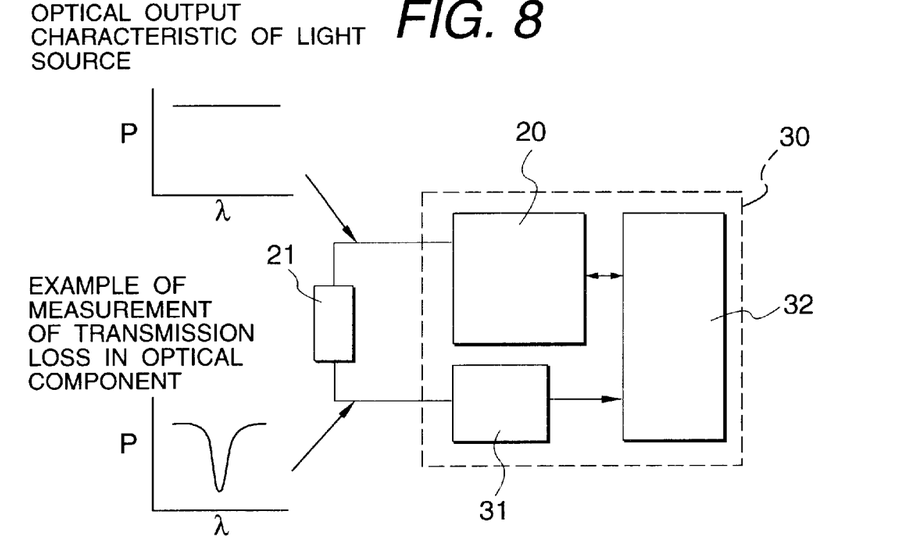
FIG. 8 shows an example of an optical component loss measurement device according to the invention, wherein the optical output characteristic of the light source and an example of measurement of a transmission loss in a substance to be measured are described in combination.

In a case where a transmission loss of an optical component using such a light source is measured, a loss is measured by means of making an optical output flat (without a necessity of any reference), as shown in an example characteristic provided in an upper left position in FIG. 8.

Figure 13A:
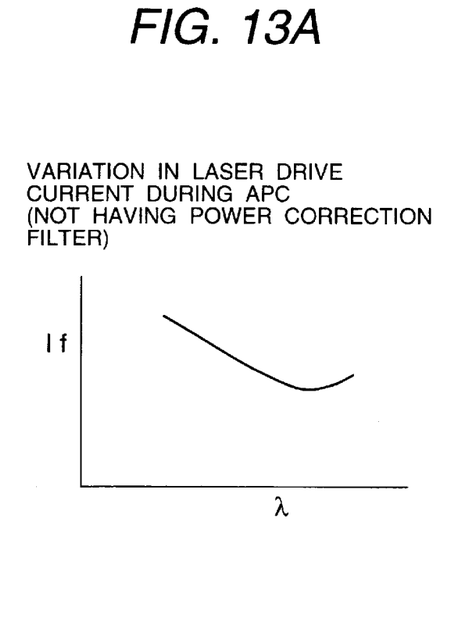
FIG. 13A is a characteristic drawing showing variations in a related-art laser drive current required at the time of APC control.

If a drive current of the semiconductor laser is subjected to auto power control (APC) for making an output flat, a drive current If must be changed greatly, as shown in FIG. 13A.

A change in current induces mode hopping or multi-mode lasing, thus rendering the lasing state of the light source unstable. As a result, there may be a case where correct measurement of transmission loss become impossible.

Even if a light-variable attenuator is provided at the output side of the optical component, high-speed tracking of the output is difficult.

SUMMARY OF THE INVENTION

An object of the present invention is to provide a wavelength-changeable light source equipped with a semiconductor laser having one end surface covered with an antireflection coating and enhancing the flatness of an optical output.

Another object of the present invention is to enable stable measurement of transmission loss of an optical element with a smaller change in current even when APC is effected with use of a drive current and with less instability of the light source, through use of a wavelength-variable light source which produces an optical output of high flatness.

To solve the above-described problem, the present invention provides a wavelength-variable light source equipped with a semiconductor laser whose one end face is provided with an antireflection coating, the light source comprising:

a power correction filter which permits transmission of the light output from the semiconductor laser, thereby rendering the characteristics of the output light substantially flat.

According to the present invention, the wavelength-variable light source is provided with a power correction filter which permits transmission of the light output from the semiconductor laser whose one end face is provided with an antireflection coating, thereby improving the flatness of the output light.

Figure 1:
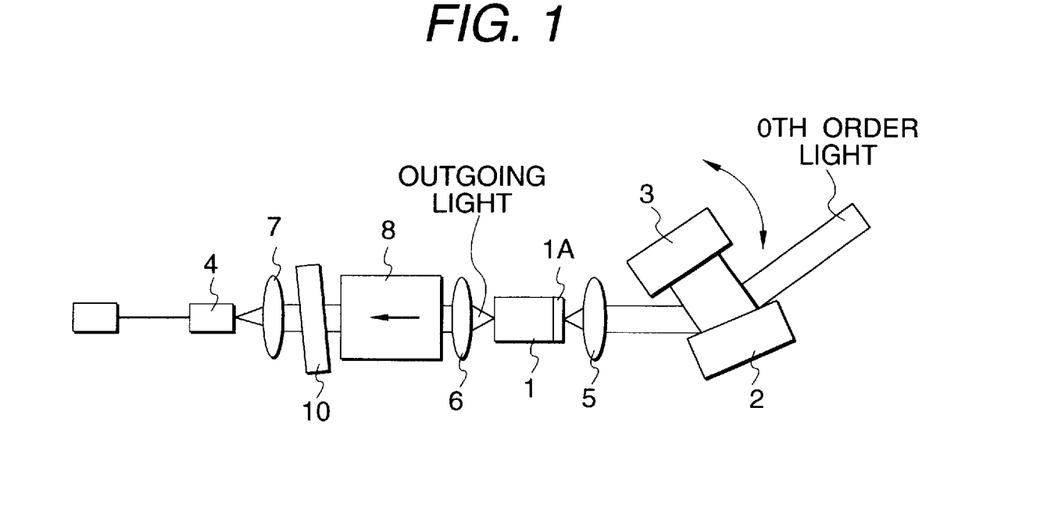
FIG. 1 is a schematic representation showing the configuration of a wavelength-variable light source according to a first embodiment of the invention.

Preferably, as shown in FIG. 1, the wavelength-variable light source is an external-resonator-type laser light source which converts the light output from the end face covered with the antireflection coating of the semiconductor laser into collimated light, returns the light to a wavelength selection optical element by means of a mirror after having subjected the light to wavelength selection by the wavelength selection optical element, subjects the light again to wavelength selection by the wavelength selection optical element, feeds back the light to the semiconductor laser, and converges and outputs light output from the other end face of the semiconductor laser on and to an optical fiber, a power correction filter being interposed between the semiconductor laser and the optical fiber.

Preferably, as shown in FIG. 1, a diffraction grating is employed as the wavelength selection optical element.

Figure 2:
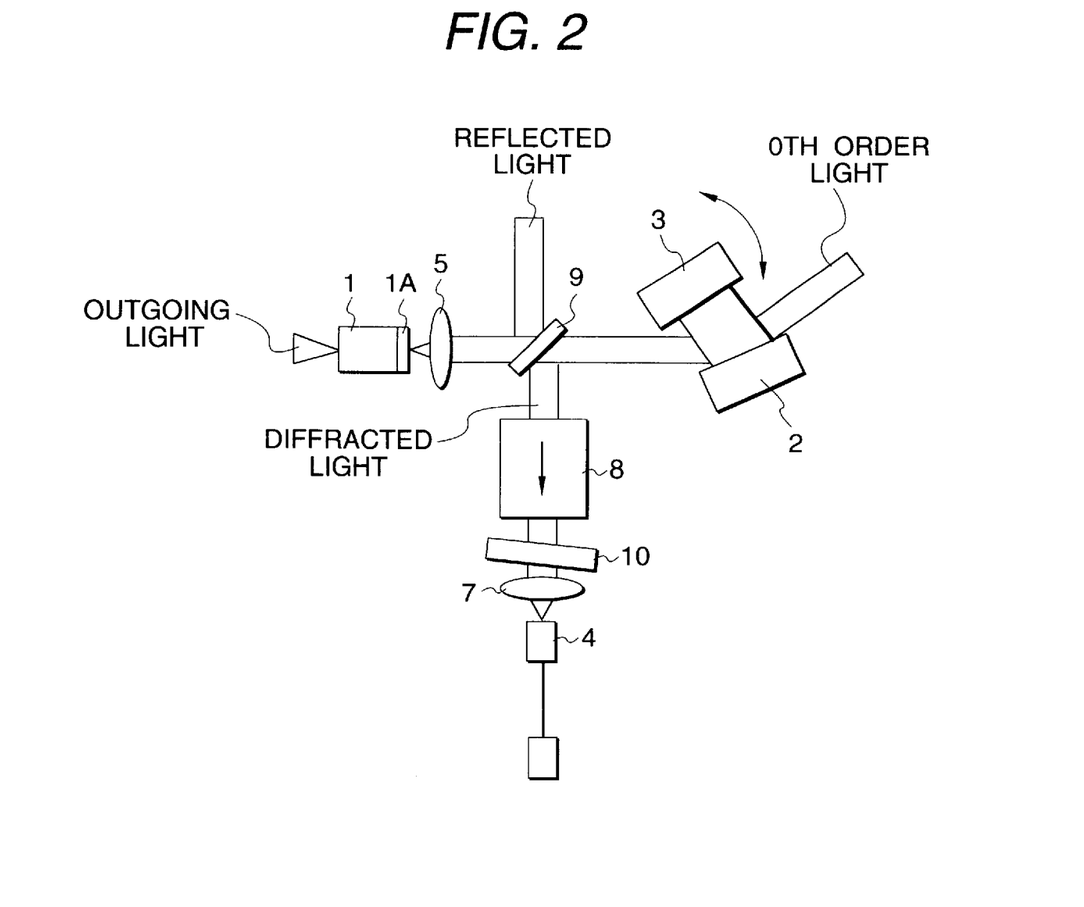
FIG. 2 is a schematic representation showing a wavelength-variable light source according to a second embodiment of the present invention.

Preferably, as shown in FIG. 2, a beam splitter 9 is interposed between the semiconductor laser 1 and the diffraction grating 2 for extracting a portion of diffracted light which is fed back from the diffraction grating 2 to the semiconductor laser, and the diffracted light extracted by the beam splitter 9 is converged on and output to the optical fiber 4 after have been caused to pass through the power correction filter 10.

Preferably, as shown in FIG. 2, the wavelength-variable light source further comprises a rotation mechanism (designated by arrows) which changes a selected wavelength by means of a change in the angle of the mirror 3.

Figure 3:
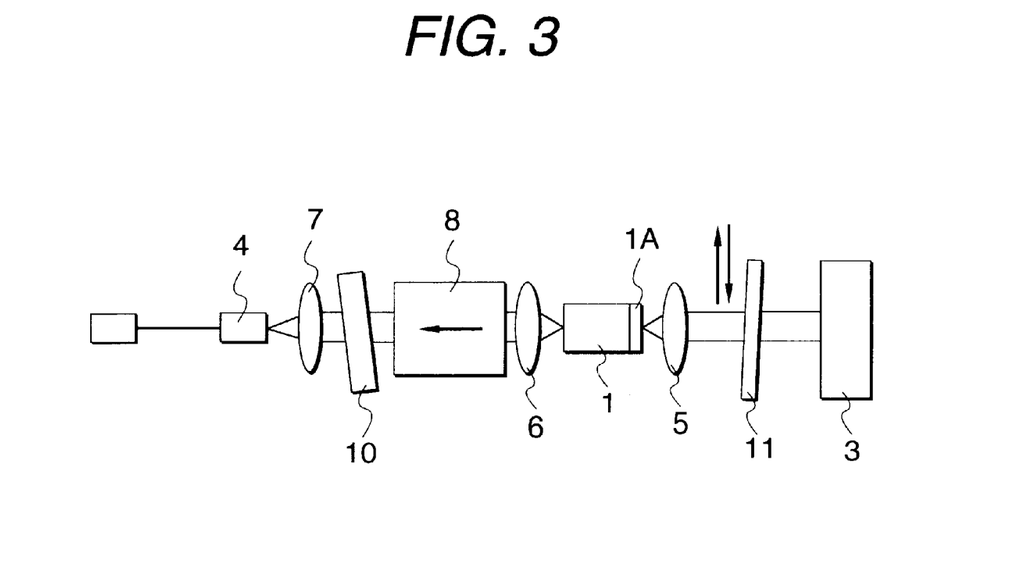
FIG. 3 is a schematic representation showing a wavelength-variable light source according to a third embodiment of the present invention.

Preferably, as shown in FIG. 3, avariable band pass filter 11 is used as the wavelength selection optical element.

Figure 4:
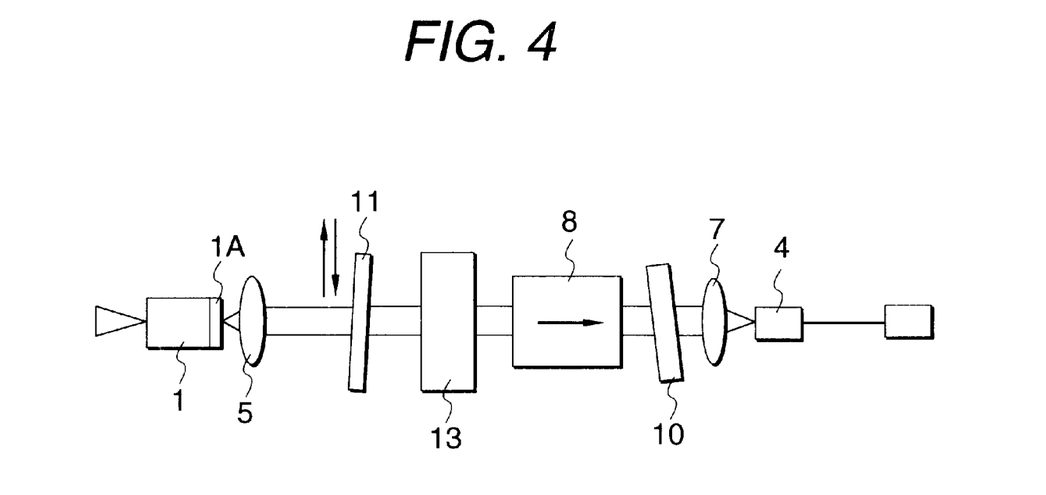
FIG. 4 is a schematic representation showing a wavelength-variable light source according to a fourth embodiment of the present invention.

Preferably, as shown in FIG. 4, a partial reflection mirror is employed as the mirror, and a portion of the light having been fed back to the semiconductor laser 1 is converged on and output to the optical fiber 4.

Preferably, a beam splitter is interposed between the semiconductor laser and the variable band pass filter 11 for extracting a portion of diffracted light which is fed back from the variable band pass filter to the semiconductor laser, and the diffracted light extracted by the beam splitter 14 is converged on and output to the optical fiber 4 after have been caused to pass through the power correction filter 10.

Figure 6:
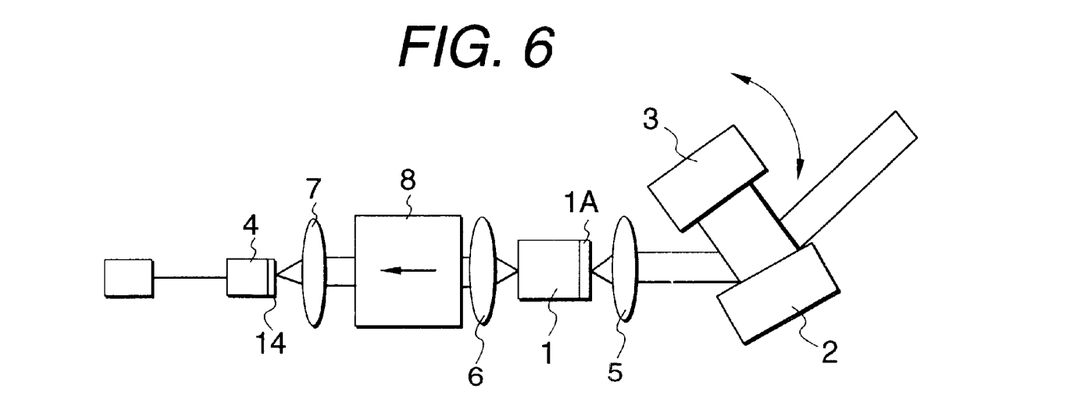
FIG. 6 is a schematic representation showing a wavelength-variable light source according to a sixth embodiment of the present invention.

Preferably, as shown in FIG. 6, the power correction filter is a power correction film 4 provided on the end face of the optical fiber.

Preferably, as shown in FIG. 8, a wavelength-variable light source is provided in a light source section and corresponds to an optical component loss measurement device which connects the light output from the light source to an optical component 21 to be measured, and measures a transmission loss in the light having passed through the optical component 21, wherein the light source section is a wavelength-variable light source 20 having any one of the above-described power correction filters 10.

Preferably, the optical component loss measurement device connects the light output from the wavelength-variable light source having the power correction filter to an optical component to be measured and measures a transmission loss in the light having passed through the optical component. Hence, the light source is subjected to small current variation even during APC of a drive current. Thus, instability of the light source is diminished, thereby enabling stable measurement of a transmission loss in an optical component.

Preferably, a shown in FIG. 8, the optical component loss measurement device further comprises:

a light-receiving section 31 for receiving light having passed through the optical component 21; and a control section 32 for computing a transmission loss in the light having passed through the optical component from information about the wavelength of the light output from the wavelength-variable light source 20 having the power correction filter 10 and from information about the power of the light output from the light-receiving section 31 and outputting a computation result, wherein the control section 32 controls a drive current to be delivered to the wavelength-variable light source having the power correction filter 10.

Figure 9:
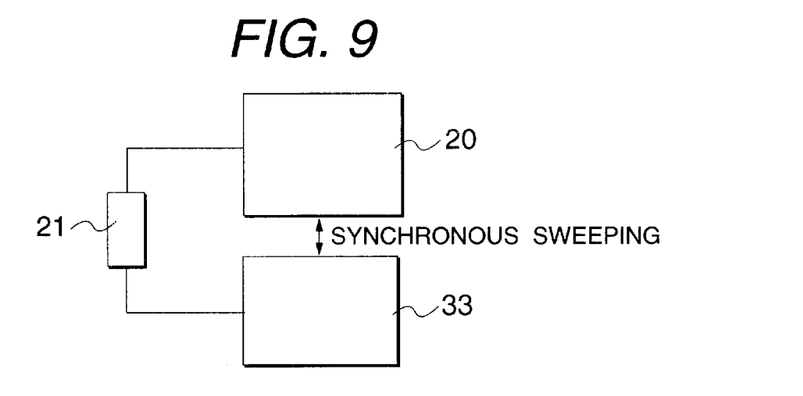
FIG. 9 is a block diagram showing another example of the optical component transmission loss measurement device according to the invention.

Preferably, as shown in FIG. 9, the optical component loss measurement device further comprises an optical spectrum analyzer 33 for receiving the light having passed through the optical component 21, in which the optical spectrum analyzer 33 and the wavelength-variable light source 20 having the power correction filter 10 perform sweeping simultaneously.

Figure 10:
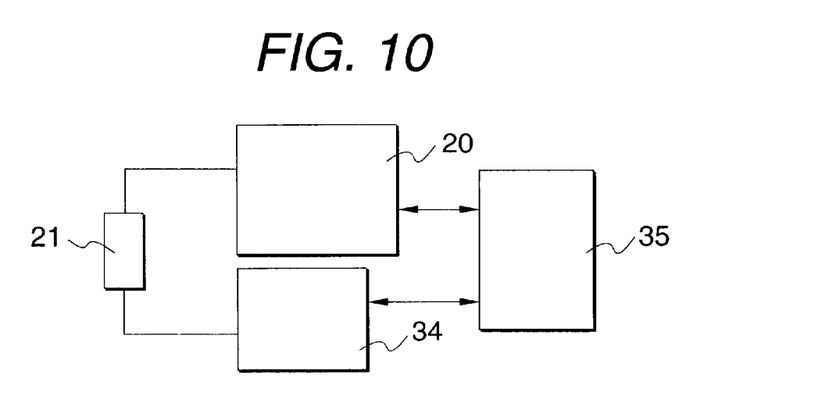
FIG. 10 is a block diagram showing still another example of the optical component transmission loss measurement device according to the invention.

Preferably, as shown in FIG. 10, the component loss measurement device further comprises an optical power meter 34 for receiving the light having passed through the optical component 21, and a control section 35 for computing a transmission loss in the light having passed through the optical component, from the information about the power of light output from the optical power meter 34, wherein the control section controls a drive current to be supplied to the wavelength-variable light source having the power correction filter.

DETAILED DESCRIPTION OF THE PRESENT INVENTION

The present invention will be described in detail hereinbelow with reference to the accompanying drawings.

First Embodiment

As shown in FIG. 1, which is based on the related-art light source shown in FIG. 14, a wavelength-variable light source according to a first embodiment is a light source of external cavity laser comprising a semiconductor laser 1; a diffraction grating 2; a mirror 3; an optical fiber 4; lenses 5, 6, and 7; an optical isolator 8; and a power correction filter 10.

One end face of the semiconductor laser 1 is covered with an antireflection coating 1A.

Outgoing light exiting from the end face covered with the antireflection coating 1A is converted into collimated light by means of the lens 5. The thus-collimated light enters the diffraction grating 2. The collimated light that has entered the diffraction grating 2 is radially split according to its wavelength. The thus-split light enters the mirror 3. Of the collimated light rays split by the diffraction grating 2, a light ray of wavelength which enters a reflection surface of the mirror 3 at right angles reenters the diffraction grating 2, where the light is split again. The thus-split light is fed back to the semiconductor laser 1 along the original optical path.

The outgoing light that has been lased is extracted, by means of converting outgoing light which has exited from the other end face of the semiconductor laser 1 into collimated light by means of the lens 6, allowing the collimated light pass through the optical isolator 8, allowing the light to penetrate through the power correction filter 10, and converging the light on the optical fiber 4 by means of the lens 7.

The power correction filter 10 is formed from colored glass, a color correction filter, or an optical interference filter.

Figure 12:
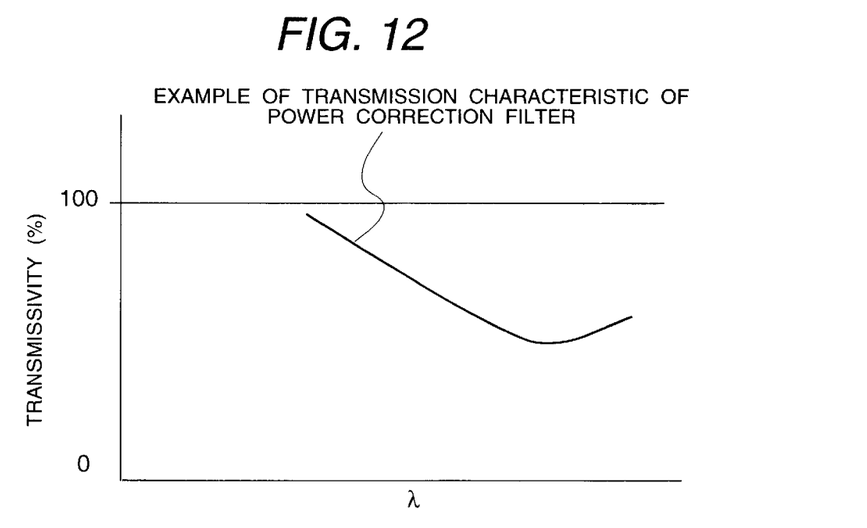
FIG. 12 is a characteristic drawing showing an example of transmission characteristics of a power correction filter.

As shown in FIG. 12, a filter having a transmission characteristic totally opposite the output characteristic of an ordinary wavelength-variable light source shown in FIG. 11 is provided as the power correction filter 10.

The light having passed through the power correction filter 10 is output to the optical fiber 4 while being maintained smooth, in the manner shown in FIG. 11.

In other words, there is obtained a wavelength-variable light source whose optical output is highly flat.

FIG. 1 shows a wavelength-variable light source equipped with a rotation mechanism (whose rotation motion is represented by a double-headed arrow) which changes a selected wavelength by means of adjusting the angle of the mirror 3. Preferably, the center of rotation of the mirror 3 is positioned at the location described in Japanese Patent Application Laid-Open No. 334420/1998 filed by the present inventor. More specifically, the center of rotation of the mirror 3 is aligned with a point of intersection between an extension of a diffraction surface of the diffraction grating 2 and a line which originates from an optical position on the uncovered end face of the semiconductor laser 1, the optical position opposing the diffraction grating 2, and extends at right angles to the optical axis.

Such a layout enables continuous sweeping without involving mode hopping at the time of wavelength sweep.

Second Embodiment

A wavelength-variable light source shown in FIG. 2 is similar to that shown in FIG. 1, except that a beam splitter 9 is provided between the semiconductor laser 1 and the diffraction grating 2 for extracting a portion of diffracted light which is fed back from the diffraction grating 2 to the semiconductor laser 1 and that the diffracted light extracted by the beam splitter 9 is converged on and output to the optical fiber 4 by way of the optical isolator 8, the power correction filter 10, and the lens 7.

A plurality of optical outputs may be produced, from among the $0^{th}$-order light ray, the reflected light ray, and the out going light ray, rather than from the diffracted light.

Third Embodiment

A wavelength-variable light source shown in FIG. 3 is similar to that shown in FIG. 1, except that a variable band pass filter 11 is employed as an optical element for selecting a wavelength. In this case, a corner reflector (corner cube mirror) may be employed for facilitating alignment.

Even in the present embodiment, light is converged on and output to the optical fiber 4 by way of the power correction filter 10 and the lens 7.

FIG. 3 shows an example in which the wavelength-variable light source is equipped with a slide mechanism (whose sliding motion is represented by two arrows) for causing the variable band pass filter 11 to change a wavelength of selection.

Fourth Embodiment

A wavelength-variable light source according to a fourth embodiment is similar to that shown in FIG. 2, except that a variable band pass filter 11 is employed as an optical element for selecting a wavelength and that the beam splitter 9 and the mirror 3 are replaced with a partial-reflection mirror 13.

Even in the present embodiment, light is converged on and output to the optical fiber 4 by way of the power correction filter 10 and the lens 7.

FIG. 4 shows an example of the wavelength-variable light source equipped with a slide mechanism (whose sliding motion is represented by two arrows) for causing the variable band pass filter 11 to change a selected wavelength.

Fifth Embodiment

Figure 5:
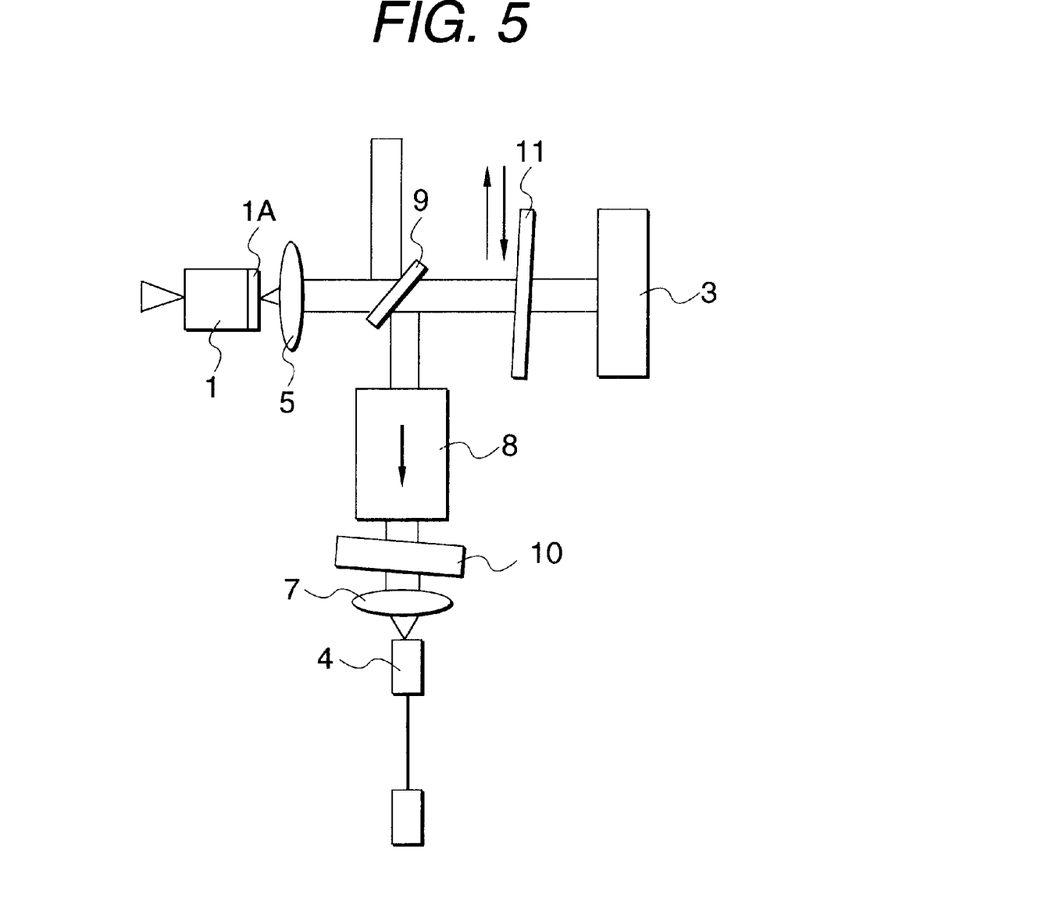
FIG. 5 is a schematic representation showing a wavelength-variable light source according to a fifth embodiment of the present invention.

A wavelength-variable light source according to a fifth embodiment is similar to that shown in FIG. 2, except that a variable band pass filter 11 is employed as an optical element for selecting a wavelength.

Even in the present embodiment, the light is converged on and output to the optical fiber 4 by way of the power correction filter 10 and the lens 7.

FIG. 5 shows an example of the wavelength-variable light source equipped with a slide mechanism (whose sliding motion is represented by two arrows) for causing the variable band pass filter 11 to change a selected wavelength.

Sixth Embodiment

A wavelength-variable light source according to a sixth embodiment shown in FIG. 6 is similar to that shown in FIG. 1, except that a power correction film 14 formed from an optical interference film is provided, as the power correction filter 10, on the end face of the optical fiber 4 opposing the lens 7.

Even in the sixth embodiment, the light is converged on and output to the optical fiber 4 by way of the lens 7 and the power correction film 14.

An Example of a Power Correction Filter Provided as an Independent Module

Figure 7A:
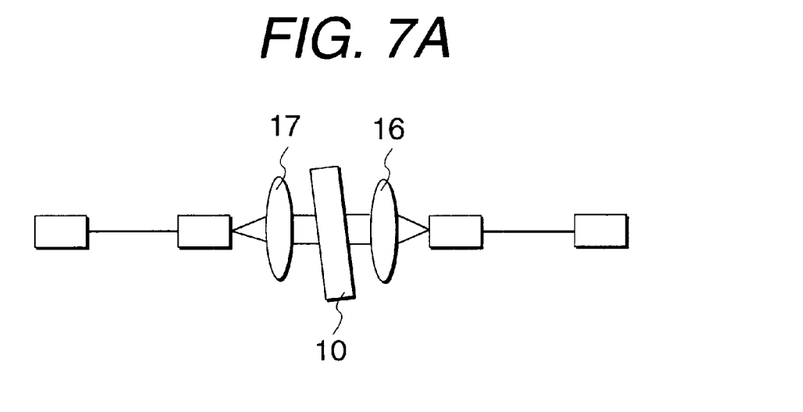
FIGS. 7A and 7B are schematic representations showing a power correction filter embodied in the form of an independent module.

As shown in FIG. 7A, the power correction filter 10 is provided as an independent module. FIG. 7C shows an example in which a power correction filter 10 provided independently is connected to the optical fiber 4 of the wavelength-variable light source, which fiber produces an output.

FIG. 7A shows a power correction filter 10 provided as an independent module, in which the optical fiber 4 is connected to one side of the filter 10 by way of a lens 16 and to the other side of the same by way of a lens 17.

As shown in FIG. 7C, the independent module of the thus-constructed power correction filter 10 is connected to the semiconductor laser 1 shown in FIG. 1, the diffraction grating 2, the mirror 3, the optical fiber 4, the lenses 5, 6, and 7, and the optical isolator 8.

Figure 7B:
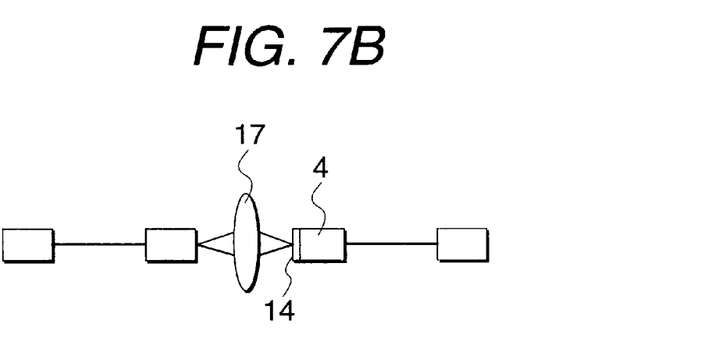
Figure 7C:
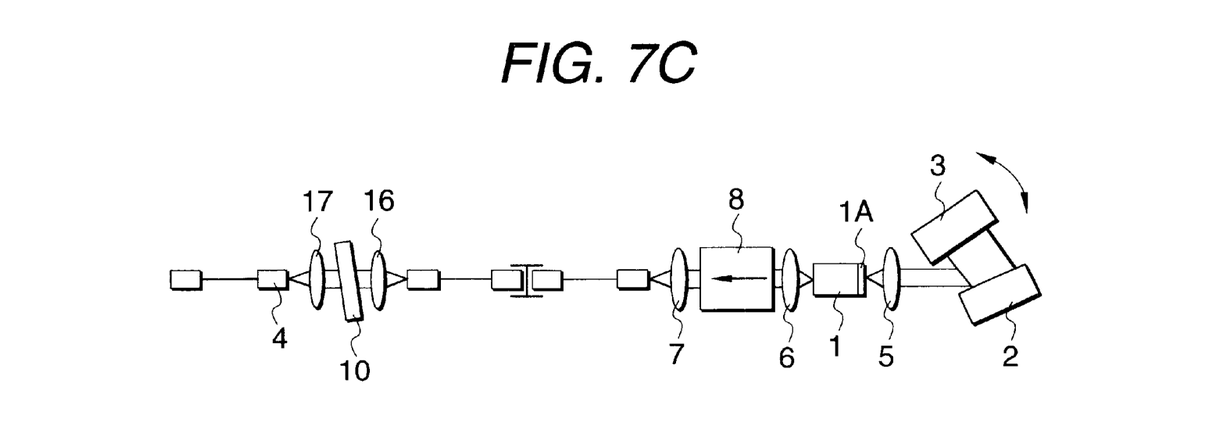
FIG. 7C is a schematic representation showing an example to which a power correction filter is applied independently.

FIG. 7B shows an independent module, in which one of the optical fibers 4 connected to the respective sides of the lens 17 is provided with the power correction film 14.

The independent module of the thus-constructed power correction film 14 may be connected to the semiconductor laser 1 shown in FIG. 1, the diffraction grating 2, the mirror 3, the optical fiber 4, the lenses 5, 6, and 7, and the optical isolator 8.

First Example of a Device for Measuring Optical Component Loss

FIG. 8 shows a first example of an optical component loss measurement device 30 which uses a wavelength-variable light source 20 equipped with the previously-described power correction filter 10.

The optical component loss measurement device 30 delivers the light output from the wavelength-variable light source 20 equipped with the power correction filter 10 to an optical component 21 to be measured and measures the light having passed through the optical component 21. Examples of the optical component to be measured include an optical coupler and an optical branching filter.

The optical component loss measurement device 30 comprises a light-receiving section 31 for receiving the light having passed through the optical component 21, and a main control section 32 which computes a transmission loss in the light having passed through the optical component 21, from information about the wavelength of the light output from the wavelength-variable light source 20 having the power correction filter 10 and from information about the power of the light output from the light-receiving section 31, and outputs the result of computation.

In the optical component loss measurement device 30, the main control section 32 controls a drive current to be supplied to the wavelength-variable light source 20 having the power correction filter 10.

In this case, as mentioned previously, the characteristics of the light output from the wavelength-variable light source 20 equipped with the power correction filter 10 exhibit a high degree of flatness, as can be seen from an upper left plot shown in FIG. 8. The transmission loss of the optical component 21 measured by the light receiver 31 shows a drop at a predetermined wavelength, as can be seen from a lower left plot shown in FIG. 8, in the case of a fiber grating or an arrayed waveguide grating (AWG).

The wavelength-variable light source performs APC of current so that an optical output is maintained constant even when a wavelength is swept. In a case where the wavelength-variable light source has no power correction filter, a large amount of change arises in the current, and a change in the refractive index of the semiconductor laser in turn induces a change in the length of an external resonator. Accordingly, mode hopping or multi-mode oscillator arises, thereby rendering the lasing state of the light source unstable and rendering correct measurement of a transmission loss difficult.

Figure 13B:
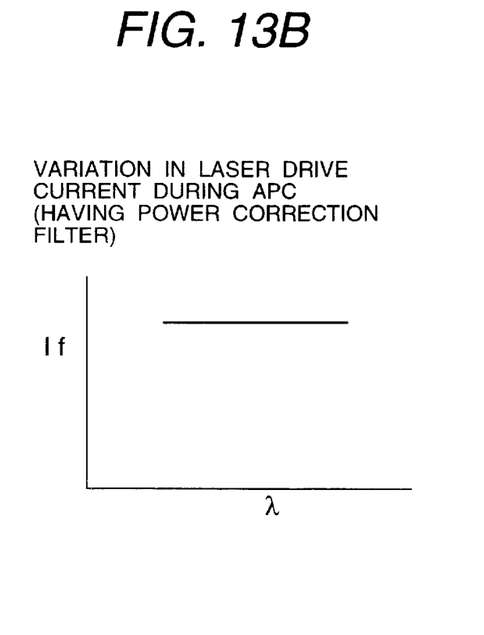
FIG. 13B is a characteristic drawing showing variations in the laser drive current according to the present invention.

In contrast, the light output from the wavelength-variable light source 20 equipped with the power correction filter 10 before APC exhibits a high degree of flatness. As shown in FIG. 13B, the amount of change in a laser drive current required during APC can be diminished to a minimum required level.

Hence, even during APC of a drive current, the wavelength-variable light source which outputs light of predetermined wavelength is susceptible to a smaller change in current. Reduction in instability of the light source enables stable measurement of a transmission loss of an optical component.

Second Example of an Optical Component Loss Measurement Device

FIG. 9 shows a second example of an optical component loss measurement device, which is equipped with an optical spectrum analyzer 33 for receiving the light having passed through the optical component 21.

In this measurement device, the optical spectrum analyzer 33 and the wavelength-variable light source 20 equipped with the power correction filter 10 perform sweeping simultaneously.

Third Example of an Optical Component Loss Measurement Device

FIG. 10 shows a third example of an optical component loss measurement device, which is equipped with an optical power meter 34 for receiving the light having passed through the optical component 21 and a controller (control section) 35 for computing a transmission loss in the light having passed through the optical component 21 from information about the power of light output from the optical power meter 34.

In the measurement device, a drive current to be supplied to the wavelength-variable light source 20 equipped with the power correction filter 10 is controlled by means of the controller 35.

In the first to third examples, the power correction filters are embodied as a color correction filter, an interference filter, and an interference film. However, the present invention is not limited to these embodiments; any type of filter may be employed, so long as the filter has the function of making the characteristic of output light substantially flat.

According to the present invention, use of a power correction filter results in an increase in the degree of flatness of output light.

According to the present invention, a wavelength-variable light source equipped with a power correction filter is employed. Hence, the light source is subjected to small current variation even during APC of a drive current. Thus, instability of the light source is diminished, thereby enabling stable measurement of a transmission loss in an optical component.

What is claimed is:

1. A wavelength-variable light source comprising:
   a semiconductor laser for emitting light, the semiconductor laser whose one end face is provided with an antireflection coating; and
   a power correction filter for permitting transmission of the light output from the semiconductor laser to render characteristics of the light substantially flat over a wavelength range.

2. The wavelength-variable light source according to claim 1, being a light source of an external cavity laser, the wavelength-variable light source further comprising:
   a first lens for converting the light output from the end face covered with the antireflection coating of the semiconductor laser into collimated light;
   a wavelength selection optical element for selectively reflecting the light depending on wavelengths of the light;
   a mirror for returning the light from the wavelength selection optical element to the wavelength selection optical element to again reflect the light on the wavelength selection optical element depending on the wavelengths of the light and to feed back the light to the semiconductor laser;
   a second lens for converging and outputting the light output from the other end face of the semiconductor laser onto an optical fiber,
   wherein the power correction filter being interposed between the semiconductor laser and the optical fiber.

3. The wavelength-variable light source according to claim 2, wherein a diffraction grating is employed as the wavelength selection optical element, and diffracts the light thereon to selectively reflect the light depending on the wavelengths thereof.

4. The wavelength-variable light source according to claim 2, wherein a variable band pass filter is used as the wavelength selection optical element.

5. The wavelength-variable light source according to claim 4, wherein a partial reflection mirror is employed as the mirror, and a portion of the light having been fed back to the semiconductor laser is converged on and output to the optical fiber.

6. The wavelength-variable light source according to claim 1, wherein the power correction filter is a power correction film provided on the end face of the optical fiber.

7. The wavelength-variable light source according to claim 1, wherein the power correction filter renders the intensity of the light substantially flat over a wavelength range.

8. A wavelength-variable light source comprising:

a semiconductor laser for emitting light, the semiconductor laser whose one end face is provided with an antireflection coating, the light source being a light source of an external cavity laser;

a power correction filter for permitting transmission of the light output from the semiconductor laser to render the characteristics of the light substantially flat over a wavelength range;

a first lens for converting the light output from the end face covered with the antireflection coating of the semiconductor laser into collimated light;

a wavelength selection optical element for selectively reflecting the light depending on wavelengths of the light;

a mirror for returning the light from the wavelength selection optical element to the wavelength selection optical element to again reflect the light on the wavelength selection optical element depending on the wavelengths of the light and to feed back the light to the semiconductor laser, wherein a diffraction grating is employed as the wavelength selection optical element, and diffracts the light thereon to selectively reflect the light depending on the wavelengths thereof;

a second lens for converging and outputting the light output from the other end face of the semiconductor laser onto an optical fiber, wherein the power correction filter being interposed between the semiconductor laser and the optical fiber; and a beam splitter being interposed between the semiconductor laser and the diffraction grating, the beam splitter for extracting a portion of diffracted light to be fed back from the diffraction grating to the semiconductor laser, wherein the diffracted light extracted by the beam splitter is converged on and output to the optical fiber after passing through the power correction filter.

9. A wavelength-variable light source comprising:

a semiconductor laser for emitting light, the semiconductor laser whose one end face is provided with an antireflection coating, the light source being a light source of an external cavity laser; and a power correction filter for permitting transmission of the light output from the semiconductor laser to render the characteristics of the light substantially flat over a wavelength range;

a first lens for converting the light output from the end face covered with the antireflection coating of the semiconductor laser into collimated light;

a wavelength selection optical element for selectively reflecting the light depending on wavelengths of the light;

a mirror for returning the light from the wavelength selection optical element to the wavelength selection optical element to again reflect the light on the wavelength selection optical element depending on the wavelengths of the light and to feed back the light to the semiconductor laser, wherein a diffraction grating is employed as the wavelength selection optical element, and diffracts the light thereon to selectively reflect the light depending on the wavelengths thereof;

a second lens for converging and outputting the light output from the other end face of the semiconductor laser onto an optical fiber, wherein the power correction filter being interposed between the semiconductor laser and the optical fiber;

a beam splitter being interposed between the semiconductor laser and the diffraction grating the beam splitter for extracting a portion of diffracted light to be fed back from the diffraction grating to the semiconductor laser, wherein the diffracted light extracted by the beam splitter is converged on and output to the optical fiber after passing through the power correction filter; and a rotation mechanism for changing an angle of the mirror with respect to the diffraction grating to change a wavelength of the light diffracted by the diffraction grating.

10. The A wavelength-variable light source comprising:

a semiconductor laser for emitting light, the semiconductor laser whose one end face is provided with an antireflection coating, wherein the variable light source being a light source of an external cavity laser;

a power correction filter for permitting transmission of the light output from the semiconductor laser to render the characteristics of the light substantially flat over a wavelength range;

a first lens for converting the light output from the end face covered with the antireflection coating of the semiconductor laser into collimated light;

a wavelength selection optical element for selectively reflecting the light depending on wavelengths of the light wherein a variable band pass filter is used as the wavelength selection optical element;

a mirror for returning the light from the wavelength selection optical element to the wavelength selection optical element to again reflect the light on the wavelength selection optical element depending on the wavelengths of the light and to feed back the light to the semiconductor laser;

a second lens for converging and outputting the light output from the other end face of the semiconductor laser onto an optical fiber, wherein the power correction filter being interposed between the semiconductor laser and the optical fiber; and a beam splitter being interposed between the semiconductor laser and the variable band pass filter, the beam splitter for extracting a portion of diffracted light to be fed back from the variable band pass filter to the semiconductor laser, wherein the diffracted light extracted by the beam splitter is converged on and output to the optical fiber after passing through the power correction filter.

11. An apparatus comprising:

a wavelength-variable light source provided in a light source section, the wavelength-variable light source comprising:

a semiconductor laser for emitting light, the semiconductor laser whose one end face is provided with an antireflection coating; and a power correction filter for permitting transmission of the light output from the semiconductor laser to render the characteristics of the light substantially flat over a wavelength range.

12. The apparatus optical component loss measurement device according to claim 11, further comprising:

a light-receiving section for receiving the light having passed through an optical component; and a control section for computing a transmission loss in the light having passed through the optical component from information on the wavelength of the light output from the wavelength-variable light source having the power correction filter and from information on the power of the light output from the light-receiving section and outputting a computation result, wherein the control section controls a drive current to be delivered to the wavelength-variable light source having the power correction filter.

13. The apparatus according to claim 11, further comprising an optical spectrum analyzer for receiving the light having passed through an optical component, in which the optical spectrum analyzer and the wavelength-variable light source having the power correction filter perform sweeping simultaneously.

14. The apparatus according to claim 11, further comprising:

an optical power meter for receiving the light having passed through an optical component; and a control section for computing a transmission loss in the light having passed through the optical component, from the information on the power of light output from the optical power meter, wherein the control section controls a drive current to be supplied to the wavelength-variable light source having the power correction filter.

15. The apparatus according to claim 11, wherein the power correction filter renders the intensity of the light substantially flat over a wavelength range.

* * * * *